United States Patent
Eni et al.

(10) Patent No.: US 12,517,168 B1
(45) Date of Patent: Jan. 6, 2026

(54) ELECTRICAL CIRCUIT ARRANGEMENT AND METHOD OF OPERATING AN ELECTRICAL CIRCUIT ARRANGEMENT FOR OBTAINING LIFETIME EXPECTANCY INFORMATION

(71) Applicant: Infineon Technologies Austria AG, Villach (AT)

(72) Inventors: Emanuel-Petre Eni, Neubiberg (DE); Karl Egil Norling, Villach (AT); Erwin Huber, Munich (DE); Guillermo Alejandro Conde Guerra, Velden (AT)

(73) Assignee: Infineon Technologies Austria AG, Villach (AT)

( * ) Notice: Subject to any disclaimer, the term of this patent is extended or adjusted under 35 U.S.C. 154(b) by 2 days.

(21) Appl. No.: 18/765,387

(22) Filed: Jul. 8, 2024

(30) Foreign Application Priority Data

Jul. 14, 2023 (DE) .......................... 102023118708.2

(51) Int. Cl.
  *G01R 31/26* (2020.01)
  *G01R 31/327* (2006.01)
  *H03K 17/687* (2006.01)

(52) U.S. Cl.
  CPC ..... *G01R 31/2642* (2013.01); *G01R 31/3277* (2013.01); *H03K 17/687* (2013.01)

(58) Field of Classification Search
  CPC .. G01R 31/26; G01R 31/2642; G01R 31/327; G01R 31/3275; G01R 31/3277; H03K 17/687
  USPC .......................................... 327/50, 574, 581
  See application file for complete search history.

(56) References Cited

U.S. PATENT DOCUMENTS

| | | | | |
|---|---|---|---|---|
| 6,094,144 | A | * 7/2000 | Dishongh | .......... G01R 31/2856 340/661 |
| 2007/0164371 | A1 | * 7/2007 | Tschanz | ............. G01R 31/2642 257/391 |
| 2023/0086132 | A1 | 3/2023 | Miyazaki | |

FOREIGN PATENT DOCUMENTS

| DE | 202020104644 U1 | 1/2021 |
|---|---|---|
| EP | 1673637 B | 2/2007 |

OTHER PUBLICATIONS

Y. Yang, et. al, "A Fast IGBT Junction Temperature Estimation Approach Based on ON-State Voltage Drop," IEEE Transactions on Industry Applications, Oct. 2020, vol. 57, No. 1, pp. 685-693.

(Continued)

*Primary Examiner* — William Hernandez
(74) *Attorney, Agent, or Firm* — Harrity & Harrity, LLP

(57) ABSTRACT

An electrical circuit arrangement includes a first diode and a semiconductor switching device electrically connected in series between a first node and a second node. The semiconductor switching device controls a switch current that includes a forward current through the first diode and a load current. A second diode and a calibration switching element are electrically connected in series between the first node and the second node. A voltage acquisition circuit obtains a voltage difference between a first voltage between the first node and the second node when the semiconductor switching device is on and the calibration switching element is off and a second voltage between the first node and the second node when the calibration switching element is on and the semiconductor switching device is off.

20 Claims, 6 Drawing Sheets

(56) References Cited

OTHER PUBLICATIONS

S. Beczkowski et. al, "Online Vce measurement method for wear-out monitoring of high power IGBT modules," 2013, 15th European Conference on Power Electronics and Applications (EPE), pp. 1-7, Lille, France.

\* cited by examiner

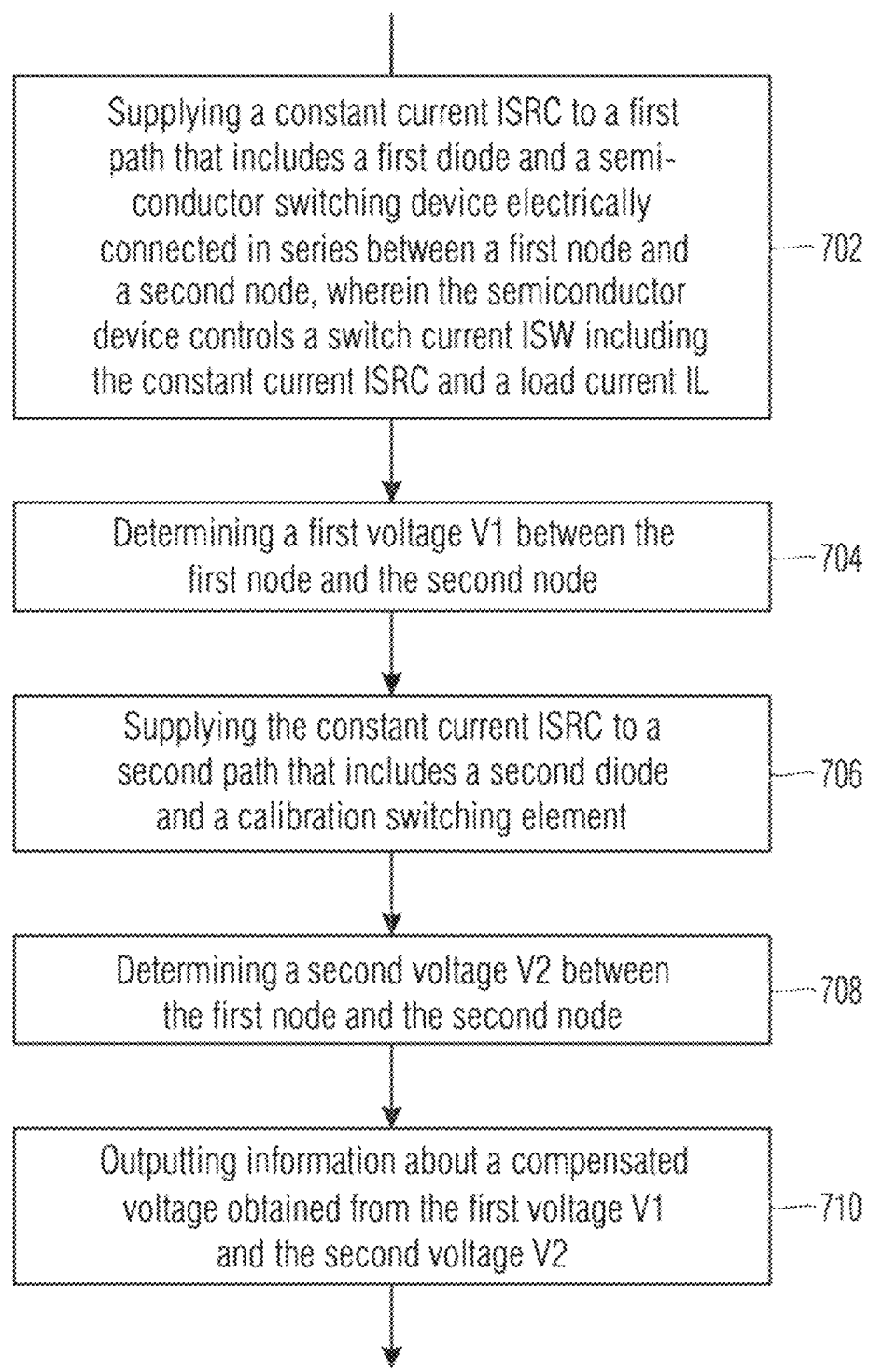

ELECTRICAL CIRCUIT ARRANGEMENT AND METHOD OF OPERATING AN ELECTRICAL CIRCUIT ARRANGEMENT FOR OBTAINING LIFETIME EXPECTANCY INFORMATION

CROSS-REFERENCE TO RELATED APPLICATION

This application claims priority to Germany Patent Application No. 102023118708.2 filed on Jul. 14, 2023, the content of which is incorporated by reference herein in its entirety.

TECHNICAL FIELD

The present disclosure relates to obtaining lifetime expectancy information about a power semiconductor device and includes an electrical circuit arrangement and a method of operating an electrical circuit arrangement.

BACKGROUND

Electrical parameters of power semiconductor devices deteriorate with advancing lifetime due to the constant and changing temperature loads until the power semiconductor device fails. Preventive monitoring methods continuously determine the accumulated thermal load. Physical methods measure the temperature directly using thermal sensors thermally coupled to the power semiconductor device or by thermal imaging. Other methods monitor temperature-sensitive electrical parameters and infer information about a thermal load from the electrical parameters. Methods of monitoring such temperature-sensitive electrical parameters like short-circuit saturation current or gate flatband voltage typically require interruption of the normal operation for applying a monitoring control or are susceptible to noise.

There is an ongoing need for obtaining information indicative for device degradation with high reliability and low circuit complexity.

SUMMARY

Instead of estimating an accumulated thermal load, the implementations of the present disclosure facilitate deriving information about lifetime expectancy based on measurements of a voltage drop across the power semiconductor switch (e.g., a semiconductor switching device).

An electrical circuit arrangement in accordance with the pertinent disclosure includes a first diode and a semiconductor switching device electrically connected in series between a first node and a second node. The semiconductor switching device controls a switch current ISW that includes a forward current I1 through the first diode and a load current IL. A second diode and a calibration switching element are electrically connected in series between the first node and the second node. A voltage acquisition circuit obtains a voltage difference $\Delta V$ between a first voltage V1 between the first node and the second node when the semiconductor switching device is on and the calibration switching element is off and a second voltage V2 between the first node and the second node when the calibration switching element is on and the semiconductor switching device is off.

The voltage difference $\Delta V$ follows the on-resistance RDSOn of the semiconductor switching device and a drift of the voltage difference $\Delta V$ images a drift of the on-resistance RDSOn. The first diode decouples the voltage acquisition circuit from high voltages in the load path of the semiconductor switching device. Measuring the second voltage through a compensation path with the second diode allows adverse effects of the first diode on the measurement result to be minimized. The electrical circuit arrangement can utilize resources that are already available for other purposes in a typical gate driver circuit and provides highly reliable lifetime expectancy information with low circuit complexity.

Those skilled in the art will recognize additional features and advantages by reading the following detailed description and viewing the accompanying drawings.

BRIEF DESCRIPTION OF THE DRAWINGS

The accompanying drawings are provided for further understanding of the implementations and form an integral part of this description. The drawings illustrate implementations of an electrical circuit arrangement and a method of operating and, together with the description, explain the principles underlying the implementations. Further implementations are described in the following detailed description and in the claims. Features of the various implementations may be combined with each other.

FIG. 6 is a schematic flow chart for illustrating a method of operating an electric circuit arrangement for obtaining lifetime expectancy information in accordance with another implementation.

DETAILED DESCRIPTION

Figure 1:
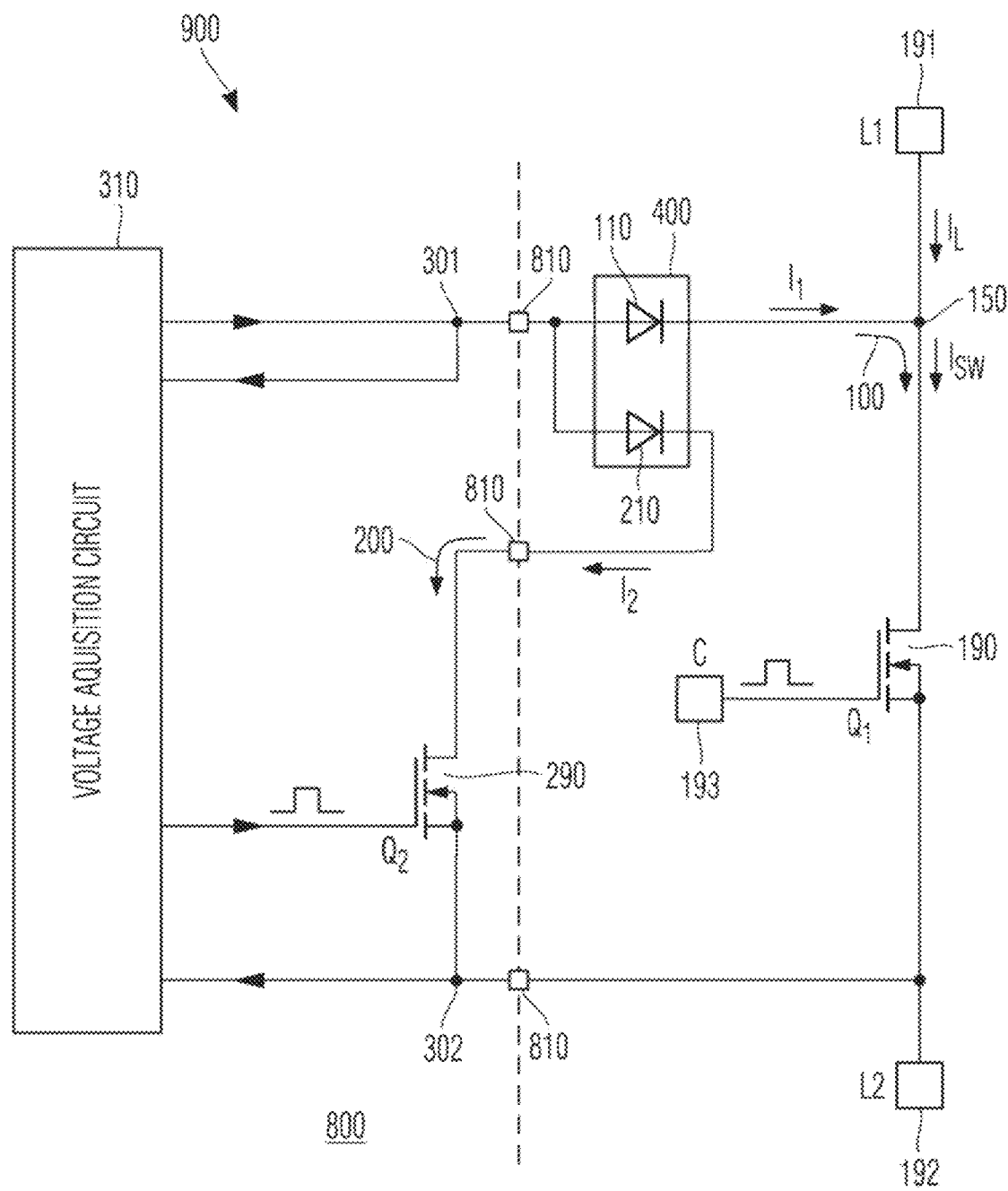
FIG. 1 is a schematic circuit diagram of an electric circuit arrangement for obtaining lifetime expectancy information in accordance with an implementation with strong thermal coupling between a first diode in a monitoring path and a second diode in a calibration path.

In the following detailed description, reference is made to the accompanying drawings which form a part of this document and in which certain implementations of a semiconductor device with active elements integrated in a high-voltage termination structure are shown as illustrations. Structural or logical changes may be made to the illustrated implementations without departing from the scope of the present disclosure. For example, features shown or described for one implementation may be used on or in conjunction with other implementations, resulting in another implementation. The present disclosure is intended to include such modifications and variations. The implementations are described in a manner that should not be construed as limiting the scope of the appended claims. The drawings are not to scale and are for illustrative purposes only. Corresponding elements are designated by the same reference numerals in the various drawings, unless otherwise indicated.

The terms "having", "containing", "including", "comprising" and the like are open-ended, and the terms indicate the presence of certain structures, elements or features but do not preclude the presence of additional elements or features. The articles "a", "an" and "the" include both the plural and singular, unless the context clearly indicates otherwise.

The term "directly electrically connected" describes a permanent low-resistive ohmic connection between electrically connected elements, for example a direct contact between the concerned elements or a low-resistive connection via a metal and/or heavily doped semiconductor material.

The terms "signal-connected" and "electrically coupled" include a permanent low-resistive ohmic connection between electrically connected elements, for example a direct contact between the concerned elements or a low-resistive connection via a metal and/or heavily doped semiconductor material, but do not preclude the presence of further passive and/or active elements in the signal path between the "signal-connected" or "electrically coupled" elements. For example, the further elements may include resistors, resistive conductor lines, capacitors and/or inductors, transistors, semiconductor diodes, Schottky diodes, transformers, opto-couplers and other.

The term "power semiconductor device" refers to semiconductor devices with a high voltage blocking capability of at least 30 V, for example 48 V, 100 V, 600 V, 1.6 kV, 3.3 kV or more and with a nominal on-state current or forward current of at least 200 mA, for example 1 A, 10 A or more.

MOSFETs (metal oxide semiconductor field effect transistor) are voltage-controlled devices and include all types of IGFETs (insulated gate field effect transistors) with gate electrodes based on doped semiconductor material and/or metal and with gate dielectrics made of oxide and/or dielectric materials other than oxides.

The safe operating area (SOA) is defined as the current and voltage conditions over which a semiconductor device can be expected to operate without self-damage.

An ohmic contact describes a non-rectifying electrical junction between two conductors, e.g., between a semiconductor material and a metal. The ohmic contact has a linear or approximately linear current-voltage (I-V) curve in the first and third quadrant of the I-V diagram as with Ohm's law.

Ranges given for physical dimensions include the boundary values. For example, a range for a parameter y from a to b reads as a≤y≤b. The same holds for ranges with one boundary value like "at most" and "at least".

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" the substrate).

Two adjoining doping regions in a semiconductor layer form a semiconductor junction. Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa. Two adjoining doping regions of complementary conductivity form a pn junction.

The Figures illustrate relative doping concentrations by indicating "−" or "+" next to the doping type "n" or "p". For example, "n-" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The present disclosure concerns an electrical circuit arrangement that includes a first diode and a semiconductor switching device electrically connected in series between a first node and a second node, wherein the semiconductor switching device is configured to control a switch current ISW that includes a forward current I1 through the first diode and a load current IL.

The first diode is connected in forward direction between the first node and a switched node, wherein an anode of the first diode is oriented to the first node and a cathode is oriented to the switched node. One or more further electric elements may be electrically connected in series with the first diode between the first node and the first diode. When a current is sourced to the first node and sunk at the second node, the sourced current flows as forward current I1 through the first diode.

The semiconductor switching device is connected between the switched node and the second node. One or more further electric elements may be electrically connected in series with the first diode between the first node and the switched node.

The semiconductor switching device may be a single power semiconductor device. The power semiconductor device may be an insulated gate bipolar transistor (IGBT), a junction field effect transistor (JFET), an insulated gate field effect transistor (IGFET), e.g., a metal oxide semiconductor field effect transistor (MOSFET) or a silicon carbide MOSFET (SiC-MOSFET), or a high electron mobility transistor (HEMT), e.g., a gallium nitride hybrid drain embedded gate injection transistor (GaN-HDGIT).

The semiconductor switching device turns on and turns off a switch current ISW that includes the forward current I1 through the first diode and a load current IL. The load current IL flows in a load circuit and is supplied to the switch node between the first diode and the semiconductor switching device.

The semiconductor switching device is part of the load circuit that further includes a power supply and a load. The power supply can be capable of supplying a current of at least 100 mA at a voltage of at least 12V. The load may include an inductive load, e.g., a transformer winding or a motor winding. When the semiconductor switching device turns on, the forward current I1 flows through the first diode and the semiconductor switching device and the load current flows through the load and the semiconductor switching device.

In a single switch configuration, the switch node may be directly connected to the positive power supply voltage. Alternatively, the semiconductor switching device may be the low side switch, and a high side switch is electrically connected between the positive power supply voltage and the switch node. The negative power supply voltage and the second node may be directly electrically connected.

A second diode and a calibration switching element are electrically connected in series between the first node and the second node.

The second diode is connected in forward direction between the first node and the calibration switching element, wherein an anode of the second diode is oriented to the first node and a cathode is oriented to the calibration switching element. When a current is sourced to the first node and sunk at the second node, the sourced current flows as forward current I2 through the second diode.

The calibration switching element is connected between the second diode and the second node. One or more further electric elements may be electrically connected in series with the second diode between the first node and the calibration switching element. One or more further electric elements may be electrically connected between the calibration switching element and the second node.

When the calibration switching element turns on, the forward current I2 through the second diode flows through the calibration switching element.

The calibration switching element may be a silicon IGFET. The calibration switching element may be a discrete device or part of an integrated gate driver circuit that further integrates a gate driver stage.

The electrical circuit arrangement further includes a voltage acquisition circuit configured to obtain a voltage difference ΔV between a first voltage V1 between the first node and the second node when the semiconductor switching device is on and the calibration switching element is off, and a second voltage V2 between the first node and the second node when the calibration switching element is on and the semiconductor switching device is off.

The voltage acquisition circuit or elements of the voltage acquisition circuit may be integrated in an integrated circuit. For example, the voltage acquisition circuit may be integrated in a gate driver circuit.

The voltage acquisition circuit may include a constant current source supplying a constant current to the first node. The constant current flows through a first path including the first diode and the semiconductor switching device when the semiconductor switching device is on and not reverse biased in a monitoring period. The constant current flows through a second path including the second diode and the calibration switching element when the calibration switching element is on and the semiconductor switching device is not reverse biased in a calibration period.

The first voltage V1 contains information about a voltage drop across the semiconductor switching device and the on-resistance RDSOn of the semiconductor switching device. The first diode decouples the voltage acquisition circuit from the load circuit controlled by the semiconductor switching device but adds a temperature dependent offset voltage to the voltage drop across the semiconductor switching device. Since it can be assumed that the second diode and the first diode are thermally coupled at least to a certain degree and the thermal coefficients of both diodes are known, the second path with the second diode and the calibration switching element offers a possibility to compensate the temperature-dependent offset voltage at least to a certain degree.

A drift in the compensated voltage reflects a drift of the voltage across the semiconductor switching device. By observing a trend in the compensated voltage for the same temperature and/or load current over time, predictions can be made about an expected remaining lifetime. For example, a rise of an average value of the compensated voltage by at least a characteristic magnitude within a predetermined period may indicate an imminent fault. The characteristic magnitude and predetermined period can be determined individually by comparative measurements for different types of semiconductor switching devices.

In some implementations, the first diode and the second diode may be integrated in an integrated circuit together with other elements of the electrical circuit arrangement, for example together with the voltage acquisition circuit and/or the calibration switching element. For example, the first diode and the second diode may be integrated in a gate driver circuit, which gate driver circuit may further integrate voltage acquisition circuit and/or the calibration switching element. In some examples, such integrated circuit may be monolithically integrated on a single semiconductor substrate.

According to an implementation, the first diode and the second diode are formed in a same semiconductor die, the first diode and the second diode are formed in different semiconductor dies integrated in a same package or the first diode and the second diode are discrete devices comprising anode leads soldered to neighboring pads of a same circuit trace on a printed circuit board (PCB) or direct bonded copper (DCB) substrate.

For example, the first diode and the second diode have equally sized and equally doped cathode regions formed in the same semiconductor die. In addition, the first diode and the second diode may have equally sized and equally doped anode regions formed in the same semiconductor die, or the cathode regions of the first diode and the second diode may extend as wells into a uniformly doped common anode region.

Alternatively, the first diode and the second diode are formed in different semiconductor dies that share a common package element, for example, a lead and/or a mold package. Each semiconductor die includes an anode pad and a cathode pad, wherein the anode pads of both semiconductor dies are soldered on a same anode lead or wherein the anode pads are connected to the same anode lead through bond wires. Alternatively or in addition, the first diode and the second diode are embedded in a same package, e.g., encapsulated in the same mold.

Alternatively, the first diode and the second diode are individual discrete devices, each of them with at least one anode component lead and at least one cathode component lead. The component leads may be lead wires for through-hole technology or terminal contacts for surface-mount technology (SMT). The anode component lead of the first diode is soldered to a first anode pad of a PCB or DBC substrate. The anode component lead of the second diode is soldered to a second anode pad of the PCB or DBC substrate. The first anode pad may be adjacent to the second anode pad with no further solder pad closer to the first anode pad than the second anode pad. A circuit trace between the first anode pad and the second anode pad shows no constrictions and no bends.

Strong thermal coupling results between the first diode and the second diode. The thermal coupling between the first diode and the second diode may be stronger than between the first diode and any other active element of the electrical circuit arrangement.

According to an implementation, a thermal coupling between the first diode and the second diode is configured to limit a difference between a first junction temperature of the first diode and a second junction temperature of the second diode to a maximum value of 20 degree Celsius during operation of the electrical circuit arrangement.

The first diode and the second diode are thermally coupled to each other sufficiently strong such that a difference between a first junction temperature of the first diode and a second junction temperature of the second diode is not greater than 20 degrees Celsius during operation.

For example, a difference between the first junction temperature and the second junction temperature is not greater than 10 degrees Celsius or 5 degrees Celsius during operation under conditions within the safe operating area.

According to an implementation, the first diode and the second diode have equal nominal device parameters.

The device parameters of the first diode and the second diode deviate from each other only as a result of process imperfections. The first diode and the second diode have the same or at least almost the same forward voltage characteristic and the same or almost the same thermal coefficient for the forward voltage.

The thermal coupling between the first diode and the second diode is sufficiently strong and the thermal coefficients for the forward voltage are sufficiently identical such that for the same forward current the voltage drops across the first diode and the second diode are equal irrespective of the temperature. Subtracting the second voltage from the first voltage compensates the temperature-dependent effect of the first diode on the measurement of the voltage drop across the semiconductor switching device. Information about the on-resistance RDSOn can be obtained without complicated characterization or estimation of the voltage drops in the first path.

When the first diode and the second diode have nearly identical thermal coefficients for the forward voltage and when the pn junctions of the first diode and the second diode are nearly identical, then the same diode current causes voltage drops of equal amount across the first diode and the second diode.

According to an implementation, the voltage acquisition circuit can be configured to obtain a voltage difference ΔV between the first voltage V1 and the second voltage V2 as the compensated voltage. The influence of the temperature of the first diode on the quality of lifetime expectation estimation can be significantly reduced.

According to an implementation, the electrical circuit arrangement may further include a desaturation control circuit configured to output an active desaturation signal when the semiconductor switching device is on, a blanking time has elapsed, and the first voltage V1 exceeds a desaturation threshold voltage.

The desaturation control circuit monitors the voltage across the turned-on semiconductor switching device, wherein an active desaturation signal indicates that the load current through the semiconductor switching device is high enough to indicate an overcurrent condition for the semiconductor switching device. If the semiconductor switching device is an IGBT, the overcurrent condition indicates a desaturation of the IGBT. If the semiconductor switching device is a MOSFET, the overcurrent condition indicates a saturation of the MOSFET. The active desaturation signal is typically used to turn off the semiconductor switching device before the semiconductor switching device gets irreversibly damaged and/or for signaling a failure to a higher instance in a system.

A voltage detection input of the desaturation control circuit needs protection against the high supply voltage in the load circuit of the semiconductor switching device. The first diode can be used for online monitoring the voltage drop across the semiconductor switching element both for getting lifetime expectancy information and for desaturation detection such that a circuit overhead for getting lifetime expectancy information is small.

The blanking time is selected long enough to avoid faulty desaturation detection close in time to turning on the semiconductor switching device.

The desaturation control circuit or elements of the desaturation control circuit may be integrated in an integrated circuit. For example, some of the elements of the desaturation control circuit may be integrated in a gate driver circuit.

According to an implementation, the electrical circuit arrangement may further include an acquisition control circuit configured to control the voltage acquisition circuit to obtain and/or process the compensated voltage when a predetermined condition is fulfilled.

The predetermined condition can be an active signal of a measurement start signal received from outside the electrical circuit arrangement or generated within the electrical circuit arrangement in response to a change of an operation condition or in response to a regular clock signal. The predetermined condition may be derived from information about an instantaneous temperature or a load current.

For obtaining the compensated voltage, a new measurement of at least the first voltage V1 is triggered. For the second voltage V2 a previously obtained value can be used. Alternatively, new measurements of both the first voltage V1 and the second voltage V2 are triggered, wherein the measurement of the second voltage V2 may precede or follow the measurement of the first voltage V1. The two measurements may be separated by one or more complete switching cycles.

According to an implementation, for each complete measurement, measurement of the second voltage V2 may precede the measurement of the first voltage V1 in the off-state period directly preceding the on-state period with the measurement of the first voltage V1. Alternatively, measurement of the second voltage V2 may follow the measurement of the first voltage V1 in the off-state period directly following the on-state period with the measurement of the first voltage V1.

The acquisition control circuit or elements of the acquisition control circuit may be integrated in an integrated circuit. For example, some of the elements of the acquisition control circuit may be integrated in a gate driver circuit.

According to an implementation, the electrical circuit arrangement may further include a processing circuit configured to receive information about the compensated voltage, generate lifetime expectancy information based on the compensated voltages obtained at different points in time, and output the lifetime expectancy information.

The compensated voltage can be the voltage difference ΔV between the first voltage and the second voltage when the first diode and the second diode have the same type and inherently the same forward voltage thermal coefficient.

The processing circuit may further receive information about the instantaneous load current. The processing circuit may compare the results of multiple measurements of the voltage drop across the semiconductor switching device and the on-resistance RDSon performed at the same temperature and/or load current IL with empirical data for long-term on-resistance gradients indicating an imminent failure.

The processing circuit or elements of the processing circuit may be integrated in an integrated circuit. For example, the processing circuit or some of the elements of the processing circuit may be integrated in a gate driver circuit.

According to an implementation, the electrical circuit arrangement may further include a gate driver stage configured to output a gate signal to the semiconductor switching device, wherein the gate signal changes between an active voltage level turning on the semiconductor switching device and an inactive voltage level turning off the semiconductor switching device.

The gate driver stage is capable of charging and discharging a gate capacity effective at the gate input of the semiconductor switching device sufficiently fast to enable a desired switching frequency in the load circuit. The gate driver stage or elements of the gate driver stage may be integrated in a gate driver circuit.

According to an implementation, the electrical circuit arrangement may include a gate voltage acquisition circuit configured to obtain and output gate voltage information about an instantaneous active voltage level of the gate signal.

The on-resistance RDSon and the voltage drop across the conducting semiconductor switching device in the on-state depend on the active voltage level (active signal level) of the gate signal. Knowledge about the current active signal level for the gate signal allows to refine the life expectancy information. If the active voltage level has not changed since the beginning of the operational lifetime, the life expectancy information derived from the compensated voltage can potentially be marked as being more reliable than otherwise.

The gate voltage acquisition circuit or elements of the gate voltage acquisition circuit may be integrated in a gate driver circuit. If for an IGFET a transfer function is available giving the drain-to-source voltage VDS as a function of the gate-to-source voltage VGS or for an IGBT a transfer function is available giving the collector-to-emitter voltage VCE as a function of the gate-to-emitter voltage VGE, the gate voltage information can be used to refine the lifetime expectancy information. The transfer functions may be locally stored in the gate voltage acquisition circuit, the voltage acquisition circuit, or the processing circuit, by way of example.

The gate voltage acquisition circuit may, for example, obtain the gate voltage information based on a measurement of the gate voltage, a measurement of a voltage at a gate pad of the gate driver, a measurement of the voltage at a gate signal output of the gate driver stage, a measurement of the voltage at a gate signal output terminal of the gate driver circuit, a measurement of the voltage at the gate terminal of the semiconductor switching device, and/or a measurement of a supply voltage of a voltage supply of the gate driver circuit.

According to an implementation, the electrical circuit arrangement may further include a junction voltage acquisition circuit configured to obtain a third voltage V3 between the first node and the second node when the calibration switching element is off and the semiconductor switching device is reverse biased and off.

The semiconductor switching device may get reverse biased when the load in the load circuit includes an inductance. The inductance has the tendency to oppose a change in the load current flowing through the inductance. For example, when in a full bridge or H bridge with four switches and a freewheeling diode parallel to each switch one of the switches turns off, the inductance may drive a current through the freewheeling diode of one of the other turned-off switches to provide a path for the current to dissipate, thereby reverse biasing the corresponding switch.

If the semiconductor switching device includes a body diode that is in the forward conduction mode when the semiconductor switching device is reverse biased, e.g., if the semiconductor switching device is a reverse conducting IGBT (RC-IGBT) or an IGFET, e.g., an MOSFET, the third voltage V3 gives information about the forward voltage of a body diode of the semiconductor switching device. The forward voltage of the body diode can be in-situ monitored during the operation of the device.

A second compensated voltage can be obtained from the third voltage V3 in a similar way as the (first) compensated voltage is obtained from the first voltage V1, e.g., by subtracting, from the third voltage V3, the second voltage V2 obtained in a calibration period from the second path for the case of two thermally strongly coupled diodes of the same type.

The junction voltage acquisition circuit or elements of the junction voltage acquisition circuit may be integrated in a gate driver circuit. If for an IGFET a degradation function is available giving a degradation as a function of the body diode forward voltage, the body diode forward voltage can be used to refine the lifetime expectancy information. The degradation function may be locally stored in the junction voltage acquisition circuit, the voltage acquisition circuit, or the processing circuit, by way of example.

Alternatively or in addition, the body diode forward voltage can be used to obtain information about an instantaneous temperature in the IGFET and/or about a total thermal budget the semiconductor switching device has been exposed to since the beginning of the operational lifetime.

According to an implementation, the processing circuit may be further configured to receive information about the third voltage V3 and/or the gate voltage information, generate the lifetime expectancy information based on the voltage difference $\Delta V$, the third voltage V3 and/or the gate voltage information, and output the lifetime expectancy information.

The same circuit elements provide information about the current on-resistance, gate voltage, and body diode forward voltage. Aside from sharing circuit resources, the implementation provides largely independent sources of information about the state of device degradation. The implementation can provide highly accurate lifetime prediction with low circuit complexity.

According to an implementation, the voltage acquisition circuit may include a constant current source configured to supply a constant current at the first node.

The constant current source may include a resistive element with a first terminal connected to a positive low or medium supply voltage and a second terminal connected to the first node. Alternatively, the constant current source may include an FET with the controlled path electrically connected between a positive low or medium supply voltage and the first node.

The constant current source may be a discrete element or may be integrated in an integrated circuit, e.g., in a gate driver circuit.

According to an implementation, the electrical circuit arrangement may include a current-limiting resistor, wherein a first terminal of the current-limiting resistor is electrically connected to the first node, and wherein a second terminal of the current-limiting resistor is electrically connected to an anode of the first diode and to an anode of the second diode.

In combination with the gate capacitance of the semiconductor switching device the current-limiting resistor defines the switching speed of the semiconductor switching device. The resistance value is selected according to application requirements. By placing the current-limiting resistor between the second node and the anodes of both the first diode and the second diode, the effect of the current-limiting resistor on the measured voltage drop across the semiconductor switching device can be fully compensated by subtracting the second voltage V2 from the first voltage V1.

The present disclosure further concerns a method of operating an electrical circuit arrangement. The method includes supplying a constant current ISRC to a first path that includes a first diode and a semiconductor switching device electrically connected in series between a first node and a second node, wherein the semiconductor switching device controls a switch current ISW including the constant current ISRC and a load current IL. A first voltage V1 caused by the constant current between the first node and the second node is determined. The method further includes supplying a constant current ISRC to a second path including a second diode and a calibration switching element electrically connected in series between the first node and the second node. A second voltage V2 caused by the constant current between the first node and the second node is determined. The method further includes outputting information about a compensated voltage obtained from the first voltage V1 and the second voltage V2.

The first voltage V1 includes information about the voltage drop across the semiconductor switching device in the on-state and about the forward voltage of the first diode, wherein the forward voltage of the first diode is a function of temperature. The compensated voltage is obtained by using the second voltage V2 to compensate at least partly for the influence of the first diode on the measurement of the voltage drop across the semiconductor switching device, wherein the compensation uses information about the temperature dependencies of the forward voltages in the first diode and the second diode, and about a possible temperature difference between the first diode and the second diode.

According to an implementation, a voltage difference ΔV between the first voltage V1 and the second voltage V2 is determined as the compensated voltage.

The stronger the thermal coupling between the first diode and the second diode, and the less the forward voltage temperature coefficients of the first diode and the second diode differ for a given forward current, the better the influence of the second diode on the measurement of the voltage drop across the semiconductor switching device can be compensated for by simply subtracting the second voltage from the first voltage.

According to an implementation, the method may further include generating an active desaturation signal when the semiconductor switching device is on, a blanking time has elapsed, and the first voltage V1 exceeds a desaturation threshold voltage. The method uses the first diode for both desaturation detection and lifetime expectancy estimation.

According to an implementation, the second voltage V2 may be obtained and/or processed when a predetermined condition is fulfilled. The predetermined condition may be derived from information about an instantaneous temperature, from an instantaneous load current and/or from a timer signal.

According to an implementation, the method may further include generating and outputting lifetime expectancy information based on the compensated voltage, e.g., the voltage difference ΔV in case of sufficient strong thermal coupling between the first diode and the second diode.

According to an implementation, the method may further include supplying a gate signal to the semiconductor switching device, wherein the gate signal changes between an active voltage level turning on the semiconductor switching device and an inactive voltage level turning off the semiconductor switching device.

According to an implementation, the method may further include obtaining and outputting gate voltage information about an instantaneous active voltage level of the gate signal.

According to an implementation, the method may further include obtaining a third voltage V3 between the first node and the second node when the calibration switching element is off and the semiconductor switching device is reverse biased.

According to an implementation, the method may further include generating lifetime expectancy information based on the compensated voltage, the third voltage V3 and/or the gate voltage information and output the lifetime expectancy information.

FIG. 1 shows an electric circuit arrangement 900 with a semiconductor switching device 190. The illustrated semiconductor switching device 190 is a MOSFET. Alternatively, the semiconductor switching device 190 can be an IGBT, a HEMT, or a GIT. The semiconductor switching device 190 is part of a load circuit that further includes a power voltage source and a low resistive load.

The power voltage source supplies a DC supply voltage of at least 12 V, 30 V, 60 V, 100 V at a load current of at least 100 mA, 1 A, or 3 A. The positive supply voltage is supplied through a first load terminal 191. Depending on the application, the positive supply voltage is supplied to the first load terminal 191 directly, through a further semiconductor switch, or through the low resistive load. The negative supply voltage is supplied to a second load terminal 192.

The low resistive load may include an inductance, e.g., a motor winding or a transformer winding and may be in a single switch configuration or in a multi-switch configuration. For example, the low resistive load may be a load with a current direction controlled by switches in a full bridge or H bridge configuration. A first terminal of the low resistive load is connected to the first load terminal 191. Depending on the switch configuration, the second terminal of the low resistive load may be connected to the positive supply voltage, to the second load terminal 192 or, in case the semiconductor switching device 190 is the low side switch in a first half bridge, to a switch node of a second half bridge.

A first path (monitoring path) 100 between a first node 301 and a second node 302 includes a first diode 110 and a controlled load path of the semiconductor switching device 190 electrically connected in series. An anode of the first diode 110 is electrically connected to the first node 301. A cathode of the first diode 110 is electrically connected to a switch node 150. The switch node 150 is electrically connected to the first load electrode 191 and the drain or collector of the semiconductor switching device 190. The source or emitter of the semiconductor switching device 190 is connected to the second load electrode 192 and the second node 302. A gate of the semiconductor switching device 190 is connected to a gate terminal 193.

The semiconductor switching device 190 controls a switch current ISW that includes a forward current I1 through the first diode and a load current IL flowing in the load circuit and supplied through the switch node 150.

In response to an active gate signal received through the gate terminal 193, the semiconductor switching device 190 turns on. When the semiconductor switching device 190 turns on, a switch current ISW flows through the semiconductor switching device 190, wherein the switch current ISW includes the forward current I1 through the first diode 110 and the load current IL.

A second path 200 between the first node 301 and the second node 302 includes a second diode 210 and a controlled load path of a calibration switching element 290 electrically connected in series. In the illustrated implementation, the calibration switching element 290 is a MOSFET.

An anode of the second diode 210 is electrically connected to the first node 301. A cathode of the second diode 210 is electrically connected to a drain of the calibration switching element 290. The source of the calibration switching element 290 is connected to the second node 302. When the calibration switching element 290 turns on, a forward current I2 through the second diode 210 flows through the calibration switching element 290.

The first diode 110 and the second diode 210 have the same device type, the same specifications, and are from the same batch or lot. The first diode 110 and the second diode 210 have the same forward voltage at the constant current ISRC supplied from the voltage acquisition circuit 310. The first diode 110 and the second diode 210 form a diode arrangement 400 that provides strong thermal coupling between the first diode 110 and the second diode 210. If the first diode 110 and the second diode 210 are discrete elements, the anode leads of the first diode 110 and the second diode 210 are soldered to contact pads arranged in close vicinity to each other and directly connected to each other through a short circuit trace.

A voltage acquisition circuit 310 is electrically connected to the first node 301, the second node 302, and the gate of the calibration switching element 290. At least in monitoring periods and calibration periods, the voltage acquisition circuit 310 supplies a constant current ISRC to the first node 301 and measures voltages between the first node 301 and the second node 302.

In the monitoring periods, the voltage acquisition circuit 310 the semiconductor switching device 190 is on and the calibration switching element is off. The voltage acquisition circuit 310 measures a first voltage V1 caused by the constant current ISRC flowing through the first path 100.

In the calibration periods, the voltage acquisition circuit 310 generates an active calibration signal. The calibration signal is active only when the semiconductor switching device 190 is off and in a voltage blocking mode with no freewheeling current flowing through a parallel freewheeling diode and/or a body diode of the semiconductor switching device 190. When the calibration switching element 290 receives the active calibration signal, the calibration switching element 290 turns on. Outside the calibration periods the calibration signal is inactive and the calibration switching element 290 is off. In the calibration periods, the voltage acquisition circuit 310 measures a second voltage V2 caused by the constant current ISRC flowing through the second path 200.

The first voltage V1 is the sum of the temperature dependent forward voltage VFV1(T, ISRC) of the first diode 110 and the voltage drop VSWon(T, ISW) across the semiconductor switching device 190 in the on-state according to equation (#1):

$$V1 = VFV1(T,\text{ISRC}) + \text{VSWon}(T,\text{ISW}) \quad (\#1)$$

The voltage V2 is the sum of the temperature dependent forward voltage VFV2(T) of the second diode 210 and the voltage drop VCALon(T, ISRC) across the calibration switching element 290 in the on-state according to equation (#2):

$$V2 = VFV2(T,\text{ISRC}) + \text{VCALon}(T,\text{ISRC}) \quad (\#2)$$

If the first diode 110 and the second diode 210 are identical and have the same junction temperature, and if the same constant current ISRC is supplied to the first node 301 in the monitoring period and the calibration period, the voltage drops VFV1 (T, ISRC) and VFV2(T, ISRC) are identical and the effect of the first diode 110 on the measurement of the on-resistance RDSon can be completely compensated by subtracting the second voltage V2 from the first voltage V1 according to equations (#3), (#4) and (#5):

$$\Delta V = V1 - V2 \quad (\#3)$$

$$\Delta V = VFV1(T,\text{ISRC}) + \text{VSWon}(T,\text{ISW}) - VFV2(T,\text{ISRC}) - \text{VCALon}(T,\text{ISRC}) \quad (\#4)$$

$$\Delta V = \text{VSWon}(T,\text{ISW}) - \text{VCALon}(T,\text{ISCR}) \quad (\#5)$$

The voltage drop VSWon(T, ISRC) across the semiconductor switching device 190 in the on-state is given by the constant current ISRC supplied by the voltage acquisition circuit 310, by the load current IL, the on-resistance RDSon, Q1 of the semiconductor switching device 190, and the on-resistance RDSon,Q2 of the calibration switching element 290 as indicated in equation (#6):

$$\Delta V = \text{RDSon},Q1 * (IL + \text{ISRC}) - \text{RDSon},Q2 * \text{ISRC} \quad (\#6)$$

The values for the constant current ISRC supplied by the voltage acquisition circuit 310 and the on-resistance RDSon, Q2 of the calibration switching element 290 are inherently known and can be locally stored in the voltage acquisition circuit 310. Typically, the load current IL exceeds the constant current ISRC by more than two orders of magnitude and equation (#5) can be approximated by equation (#7):

$$\Delta V = \text{RDSon},Q1 * IL \quad (\#7)$$

Information about the instantaneous load current IL is usually available and/or can be obtained from a current sensing element integrated in the semiconductor switching device 190 or otherwise in the load circuit.

Subtracting the second voltage V2 from the first voltage V1 compensates the temperature-dependent effect of the first diode 110 on the measurement of the voltage drop across the semiconductor switching device 190 and on the on-resistance RDSOn, Q1 of the semiconductor switching device 190 without complicated characterization or estimation of the voltage drops in the first path 100.

The compensated voltage is obtained multiple times in-situ at regular intervals during normal operation. Changes of the compensated voltage over time are analyzed. A drift in the compensated voltage reflects a drift of the on-resistance RDSOn, Q1 of the semiconductor switching device 190. From a characteristic drift of the on-resistance RDSOn,Q1, a prediction can be made about an expected remaining lifetime. For example, an increasingly steeper rise of an average value of the compensated voltage by at least a characteristic magnitude within a predetermined period may indicate an imminent fault.

The characteristic magnitude and predetermined period can be determined in advance by comparative measurements for different types of semiconductor switching devices and can depend on the load current in an application and the typical junction temperature during operation.

The voltage acquisition circuit 310 and the calibration switching element 290 may be integrated in an integrated circuit. For example, the voltage acquisition circuit 310 and the calibration switching element 290 are integrated in a gate driver circuit 800 with terminals 810 for accessing the first node 301, the second node 302 and a drain of the calibration switching element 290.

Figure 2:
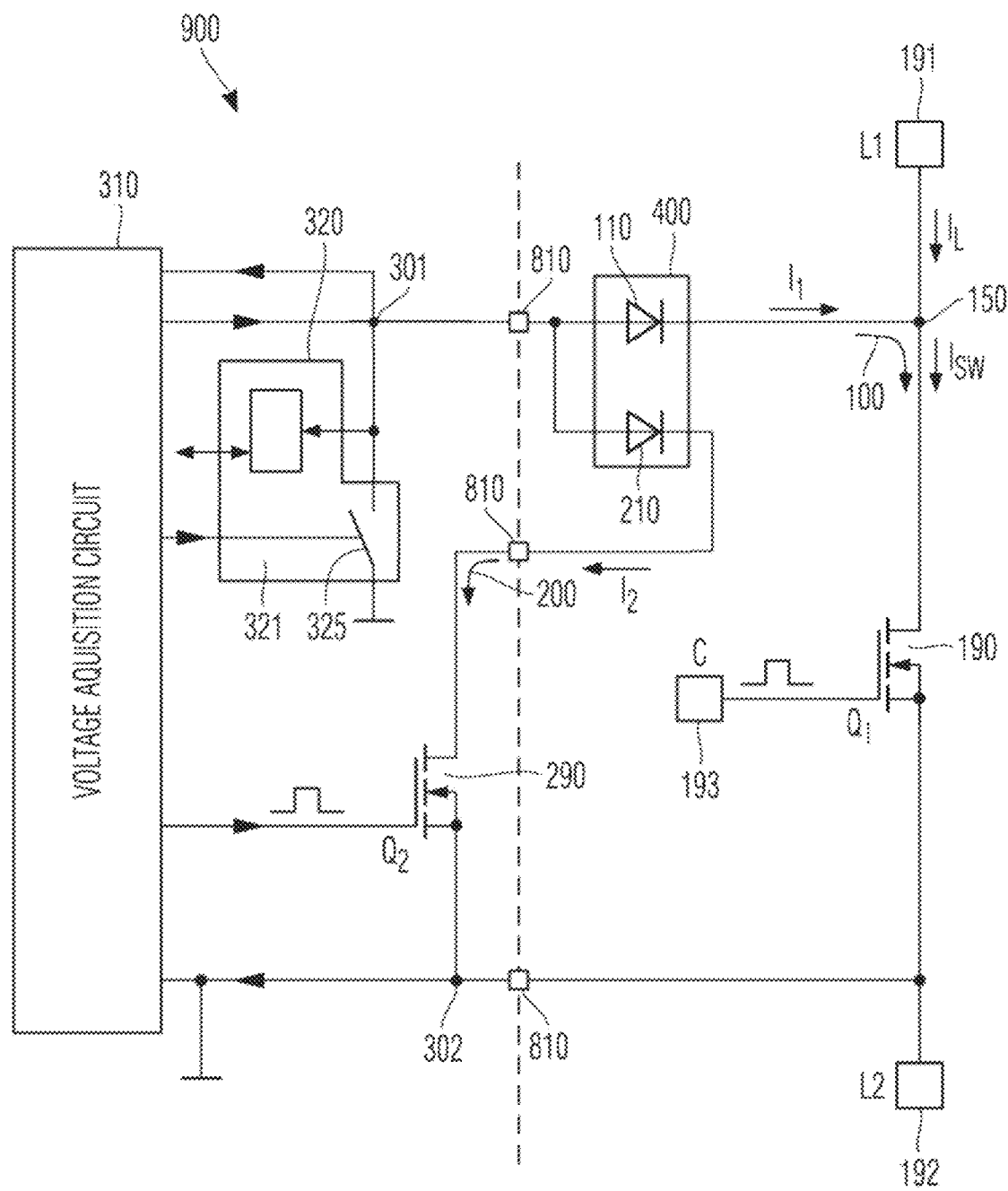
FIG. 2 is a schematic circuit diagram of an electric circuit arrangement for obtaining lifetime expectancy information in accordance with an implementation with a desaturation control circuit.

In FIG. 2 the electrical circuit arrangement 900 includes a desaturation control circuit 320. The desaturation control circuit 320 includes a comparing circuit 321 and a desaturation clamp switch 325.

An active clamp enable signal turns on the desaturation clamp switch 325 when the semiconductor switching device 190 is off. After the semiconductor switching device 190 has turned on, the clamp enable signal remains active until a blanking time elapses. The blanking time ensures no unintended tripping occurs while turning on the semiconductor switching device 190. When the blanking time has elapsed, the clamp enable signal gets inactive and the desaturation clamp switch 325 turns off thereby releasing the clamp.

When the clamp is released, the voltage at the first node 301 follows the voltage at the switch node 150. The comparing circuit 321 compares the voltage at the first node 301 with a desaturation threshold voltage.

If the semiconductor switching device 190 is, the semiconductor switching device 190 is typically saturated when the semiconductor switching device 190 is on. Only a low voltage drops across the semiconductor switching device 190. When the semiconductor switching device 190 exceeds the maximum current ratings, the bipolar semiconductor switching device 190 is the to be oversaturated. The voltage across the semiconductor switching device 190 increases and the voltage at the first node 301 increases accordingly.

If the semiconductor switching device 190 is a unipolar device that uses only one type of charge carriers for conduction, e.g., a SiC-MOSFET, the semiconductor switching device 190 is not necessarily saturated when the semiconductor switching device 190 is on. But the unipolar semiconductor switching device 190 may saturate, when the semiconductor switching device 190 exceeds the maximum current ratings. The voltage across the semiconductor switching device 190 increases and the voltage at the first node 301 increases accordingly.

If during the on-state of the semiconductor switching device 190 the voltage at the first node 301 exceeds the desaturation threshold voltage, the comparing circuit 321 outputs an active desaturation signal. In response to an active desaturation signal, a further logic circuit may initiate a safe turn-off procedure to protect the semiconductor switching device 190.

The measurement of the first voltage V1 and the comparison with the desaturation threshold voltage may be performed contemporaneously and may share some circuit elements in addition to the first diode 110, e.g., an analog-to-digital converter (ADC) converting the voltage at the first node 301 to a digital value. For the measurement of the second voltage V2, the desaturation clamp is released and the desaturation clamp switch 325 is off. Alternatively, the second diode 210 and the calibration switching element 290 may act as desaturation clamp.

Figure 3:
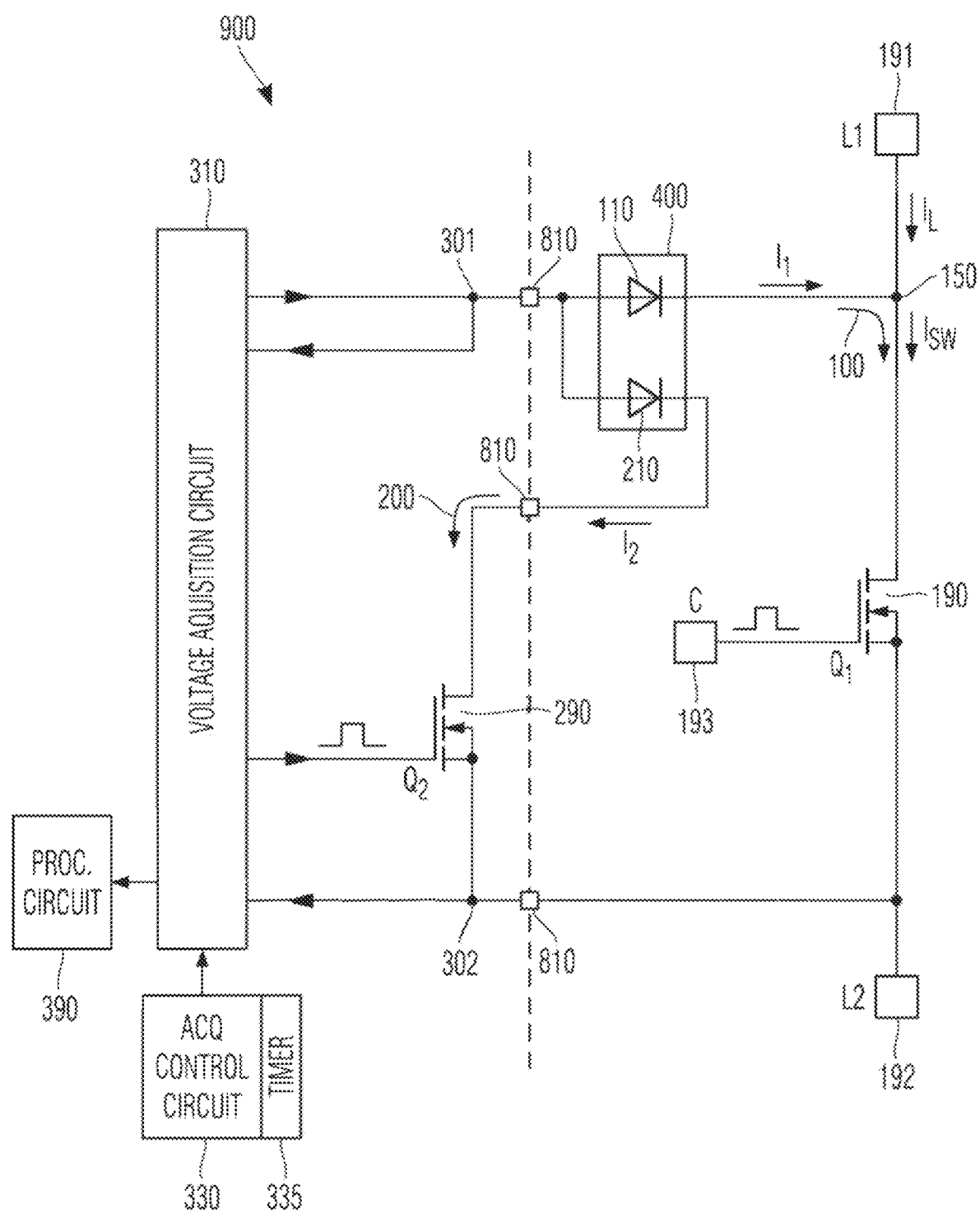
FIG. 3 is a schematic circuit diagram of an electric circuit arrangement for obtaining lifetime expectancy information in accordance with an implementation with an acquisition control circuit.

The electrical circuit arrangement illustrated in FIG. 3 includes an acquisition control circuit 330 and a processing circuit 390.

The acquisition control circuit 330 includes a timer 335 that controls the acquisition control circuit 330 to output an active acquisition signal each time a timing condition is fulfilled. In response to an active acquisition signal, the voltage acquisition circuit 310 triggers a measurement of the first voltage V1, may also trigger a measurement of the second voltage V2, and obtains information about the voltage difference ΔV based on the newly obtained first voltage V1 and the last obtained second voltage V2.

The processing circuit 390 receives the information about the voltage difference ΔV. The processing circuit 390 outputs the information about the voltage difference ΔV and/or lifetime expectancy information obtained from the voltage difference Δ through a data interface. The lifetime expectancy information may be based on additional information locally stored and accessible by the processing circuit 390 and/or information obtained from further measurements.

Figure 4:
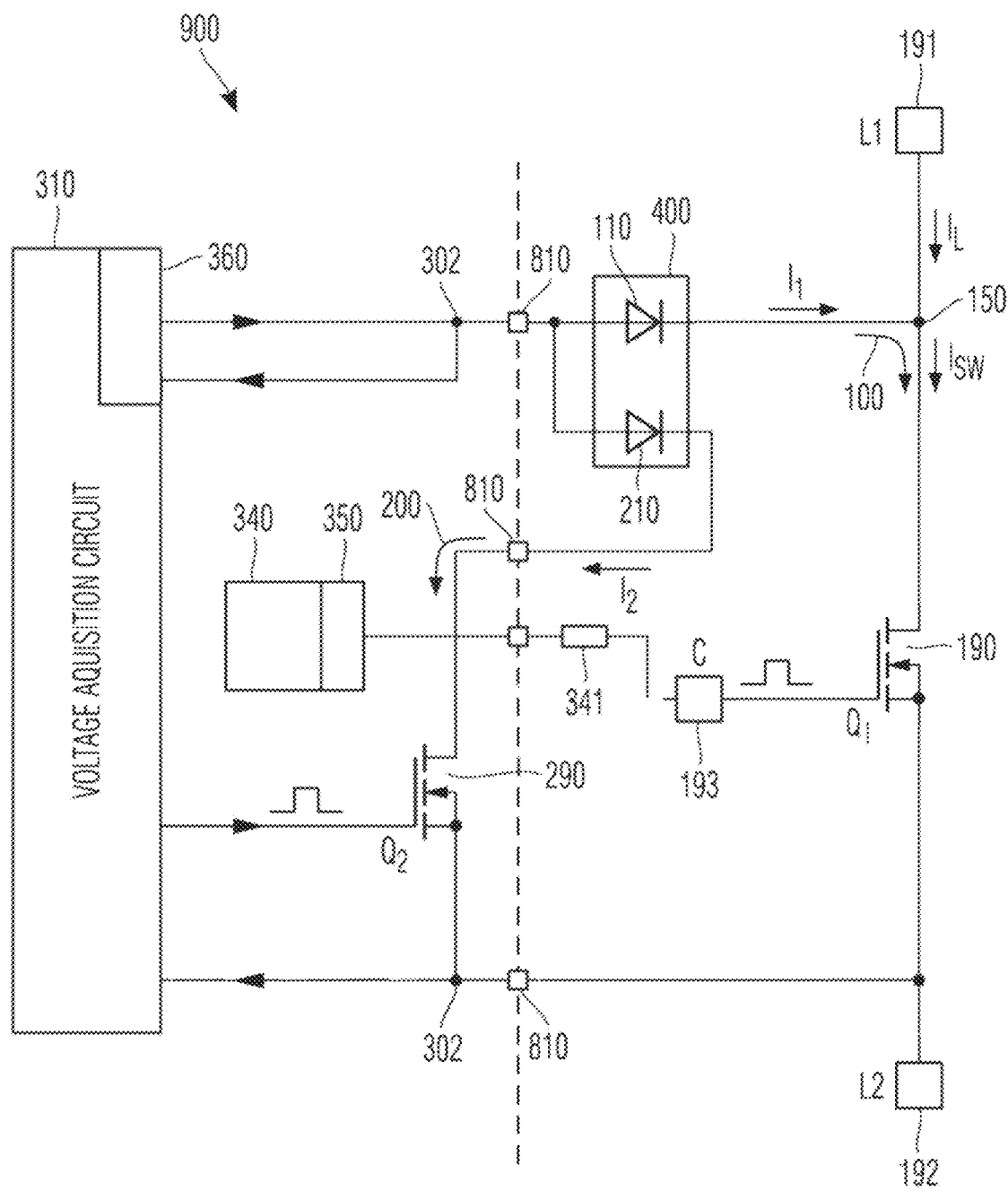
FIG. 4 is a schematic circuit diagram of an electric circuit arrangement for obtaining lifetime expectancy information in accordance with an implementation with a gate driver stage and a junction voltage acquisition circuit.

FIG. 4 shows an electrical circuit arrangement 900 that includes a gate driver stage 340 and a gate voltage acquisition circuit 350.

The gate driver stage 340 outputs a gate signal at a gate signal output. A voltage level of the gate signal changes between an inactive low level for turning off the semiconductor switching device 190 and an active high level for turning on the semiconductor switching device 190. A gate resistor 341 is electrically connected between the gate signal output of the gate driver stage 340 and the gate of the semiconductor switching device 190.

The gate voltage acquisition circuit 350 obtains gate voltage information about an instantaneous active voltage level of the gate signal. For example, the gate voltage acquisition circuit 350 may include an ADC converting the voltage of the active gate signal at the gate signal output of the gate driver stage 340 or the gate of the semiconductor switching device 190 into a digital value.

The electrical circuit arrangement 900 further includes a junction voltage acquisition circuit 360. The junction voltage acquisition circuit 360 obtains a third voltage V3 between the first node 301 and the second node 302 when the calibration switching element 290 is off and the semiconductor switching device 190 is reverse biased and off.

If combined with a desaturation control circuit 320 as illustrated in FIG. 2, the desaturation clamp is released and the desaturation clamp switch 325 is off for the measurement of the third voltage V3.

If the semiconductor switching device 190 is a MOSFET, the third voltage V3 gives information about the forward voltage of a body diode of the semiconductor switching device 190. The forward voltage of the body diode can be in-situ monitored during the operation of the device and can be used to further refine the lifetime expectancy estimation.

Figure 5:
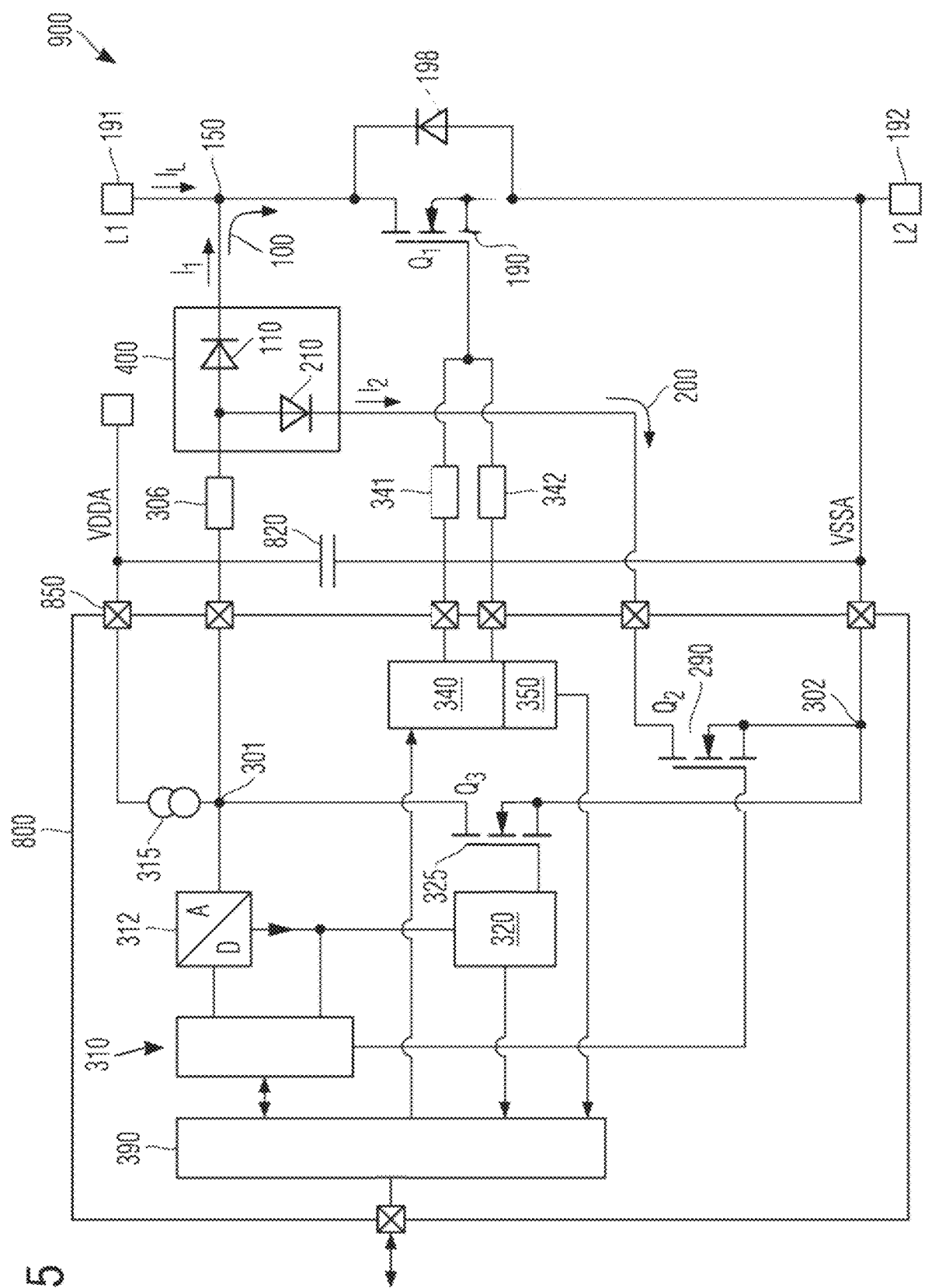
FIG. 5 is a schematic circuit diagram of an electric circuit arrangement for obtaining lifetime expectancy information in accordance with an implementation with a monitoring path and a calibration path sharing a common current-limiting resistor.

In FIG. 5, the electrical circuit arrangement 900 includes a constant current source 315 electrically connected between a positive analog supply voltage VDD and the first node 301. The constant current source 315 may be directly electrically connected to the first node 301 or through an intervening element, e.g., a semiconductor switch. The constant current source 315 is part of the voltage acquisition circuit 310. The constant current source 315 supplies a constant current ISRC to the first node 301 for the voltage measurements in the monitoring and calibration periods and, if applicable, for the measurement of the third voltage V3 for obtaining information about the forward voltage across the body diode. The constant current ISRC may be in a range from 100 μA to 10 mA, e.g., from 500 μA to 2 mA.

A first terminal of a current-limiting resistor 306 is electrically connected to the first node 301 and a second terminal of the current-limiting resistor 306 is electrically connected to an anode of the first diode 110 and to an anode of the second diode 210.

A voltage drop across the current-limiting resistor 306 is the same when measuring the first voltage V1 and when measuring the second voltage V2 and is completely compensated for when the second voltage V2 is subtracted from the first voltage V1.

The electrical circuit arrangement 900 includes a gate driver stage 340, a gate voltage acquisition circuit 350, and a second gate resistor 342 electrically connected between a gate clamp output of the gate driver stage 340 and the gate of the semiconductor switching device 190.

A smoothing capacitor 820 is electrically connected between the positive analog supply voltage VDDA and the negative analog supply voltage VSSA. The negative analog supply voltage VSSA, the second node 302 and the second load terminal 192 are directly electrically connected to each other through permanent low resistive conductor lines.

A desaturation control circuit 320 includes an n-channel MOSFET as desaturation clamp switch 325. The voltage acquisition circuit 310 and the desaturation circuit 320 share a common ADC 312 for converting a voltage at the first node 301 into a digital value.

A processing circuit 390 receives information about the voltage difference ΔV, a third voltage V3 containing information about the forward voltage of the body diode and/or gate voltage information, generates the lifetime expectancy information based on the voltage difference ΔV, the third voltage V3 and/or the gate voltage information, and outputs the lifetime expectancy information through a digital interface.

FIG. 6 shows a method of operating an electrical circuit arrangement. A constant current ISRC is supplied to a first path that includes a first diode and a semiconductor switching device electrically connected in series between a first node and a second node (702), wherein the semiconductor switching device controls a switch current ISW including the constant current ISRC and a load current IL. A first voltage V1 between the first node and the second node is determined (704). The constant current ISRC is supplied to a second path including a second diode and a calibration switching element electrically connected in series between the first node and the second node (706). A second voltage V2 caused by the constant current between the first node and the second node is determined (708). The method further includes outputting information about a compensated voltage obtained from the first voltage V1 and the second voltage V2 (710).

The invention claimed is:

1. An electrical circuit arrangement, comprising:
   a first diode and a semiconductor switching device electrically connected in series between a first node and a second node, wherein the semiconductor switching device is configured to control a switch current including a forward current through the first diode and a load current;
   a second diode and a calibration switching element electrically connected in series between the first node and the second node; and
   a voltage acquisition circuit configured to obtain a compensated voltage from a first voltage between the first node and the second node when the semiconductor switching device is on and the calibration switching element is off and a second voltage between the first node and the second node when the calibration switching element is on and the semiconductor switching device is off.

2. The electrical circuit arrangement according to claim 1, wherein the first diode and the second diode are formed in a same semiconductor die, the first diode and the second diode are formed in different semiconductor dies integrated in a same package or the first diode and the second diode are discrete devices comprising anode leads soldered to neighboring pads of a same circuit trace on a printed circuit board or direct bonded copper substrate.

3. The electrical circuit arrangement according to claim 1, wherein a thermal coupling between the first diode and the second diode is configured to limit a difference between a first junction temperature of the first diode and a second junction temperature of the second diode to a maximum value of 20 degree Celsius during operation of the electrical circuit arrangement.

4. The electrical circuit arrangement according to claim 1, wherein the first diode and the second diode have equal nominal device parameters.

5. The electrical circuit arrangement according to claim 1, wherein the voltage acquisition circuit is configured to obtain a voltage difference between the first voltage and the second voltage as the compensated voltage.

6. The electrical circuit arrangement according to claim 1, further comprising:
   a desaturation control circuit configured to output an active desaturation signal when the semiconductor switching device is on, a blanking time has elapsed, and the first voltage exceeds a desaturation threshold voltage.

7. The electrical circuit arrangement according to claim 1, further comprising:
   an acquisition control circuit configured to control the voltage acquisition circuit to obtain and/or process the compensated voltage when a predetermined condition is fulfilled.

8. The electrical circuit arrangement according to claim 1, further comprising:
   a processing circuit configured to receive information about the compensated voltage, generate lifetime expectancy information based on compensated voltages obtained at different points in time, and output the lifetime expectancy information.

9. The electrical circuit arrangement according to claim 1, further comprising:
   a gate driver stage configured to output a gate signal to the semiconductor switching device, wherein the gate signal changes between an active voltage level to turn on the semiconductor switching device and an inactive voltage level to turn off the semiconductor switching device.

10. The electrical circuit arrangement according to claim 9, further comprising:
    a gate voltage acquisition circuit configured to obtain and output gate voltage information about an instantaneous active voltage level of the gate signal.

11. The electrical circuit arrangement according to claim 1, further comprising:
    a junction voltage acquisition circuit configured to obtain a third voltage between the first node and the second node when the calibration switching element is off and the semiconductor switching device is reverse biased and off.

12. The electrical circuit arrangement according to claim 11, further comprising:
    a processing circuit configured to receive information about the compensated voltage, generate lifetime expectancy information based on compensated voltages obtained at different points in time, and output the lifetime expectancy information; and
    a gate voltage acquisition circuit configured to obtain and output gate voltage information about an instantaneous active voltage level of a gate signal of the semiconductor switching device,
    wherein the processing circuit is further configured to receive information about at least one of the third voltage or the gate voltage information, generate the lifetime expectancy information based on at least one of the voltage difference, the third voltage, or the gate voltage information, and output the lifetime expectancy information.

13. The electrical circuit arrangement according to claim 1, further comprising:
a constant current source configured to supply a constant current at the first node.

14. The electrical circuit arrangement according to claim 1, further comprising:
a current-limiting resistor, wherein a first terminal of the current-limiting resistor is electrically connected to the first node, and wherein a second terminal of the current-limiting resistor is electrically connected to an anode of the first diode and to an anode of the second diode.

15. A method of operating an electrical circuit arrangement, the method comprising:
supplying a constant current to a first path comprising a first diode and a semiconductor switching device electrically connected in series between a first node and a second node and determining a first voltage between the first node and the second node, wherein the semiconductor switching device controls a switch current including the constant current and a load current;
supplying the constant current to a second path comprising a second diode and a calibration switching element electrically connected in series between the first node and the second node and determining a second voltage caused by the constant current between the first node and the second node; and
outputting information about a compensated voltage obtained from the first voltage and the second voltage.

16. The method according to claim 15, wherein a voltage difference between the first voltage and the second voltage is determined as the compensated voltage.

17. The method according to claim 16, further comprising:
generating an active desaturation signal when the semiconductor switching device is on, a blanking time has elapsed, and the first voltage exceeds a desaturation threshold voltage.

18. The method according to claim 15, wherein the second voltage is obtained when a predetermined condition is fulfilled.

19. The method according to claim 15, further comprising:
generating and outputting lifetime expectancy information based on the compensated voltage.

20. The method according to claim 15, further comprising:
supplying a gate signal to the semiconductor switching device, wherein the gate signal changes between an active voltage level to turn on the semiconductor switching device and an inactive voltage level to turn off the semiconductor switching device.

* * * * *